US011442370B2

(12) United States Patent
Chuang et al.

(10) Patent No.: US 11,442,370 B2
(45) Date of Patent: Sep. 13, 2022

(54) RETICLE RETAINING SYSTEM

(71) Applicant: GUDENG PRECISION INDUSTRIAL CO., LTD, New Taipei (TW)

(72) Inventors: Chia-Ho Chuang, New Taipei (TW); Hsing-Min Wen, New Taipei (TW); Hsin-Min Hsueh, New Taipei (TW); Yi-Hsuan Lee, New Taipei (TW); Ming-Chien Chiu, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 157 days.

(21) Appl. No.: 16/798,456

(22) Filed: Feb. 24, 2020

(65) Prior Publication Data

US 2021/0116821 A1   Apr. 22, 2021

Related U.S. Application Data

(60) Provisional application No. 62/915,652, filed on Oct. 16, 2019.

(51) Int. Cl.
*H01L 21/673* (2006.01)
*G03F 7/20* (2006.01)

(52) U.S. Cl.
CPC ........ *G03F 7/70741* (2013.01); *G03F 7/7075* (2013.01); *H01L 21/67359* (2013.01)

(58) Field of Classification Search
CPC ......... H01L 21/67359; H01L 21/67353; H01L 21/67369; H01L 21/67386
USPC ....................................... 206/454, 710, 722
See application file for complete search history.

(56) References Cited

U.S. PATENT DOCUMENTS

| 4,776,462 A | 10/1988 | Kosugi et al. |
| 6,513,654 B2 * | 2/2003 | Smith ............... G03F 1/66 206/454 |
| 8,220,630 B1 * | 7/2012 | Ku .................. G03F 1/66 206/454 |
| 8,921,812 B2 | 12/2014 | Suzuki et al. |

(Continued)

FOREIGN PATENT DOCUMENTS

| JP | H07297272 A | 11/1995 |
| JP | 2012255958 A | 12/2012 |

(Continued)

*Primary Examiner* — Steven A. Reynolds
(74) *Attorney, Agent, or Firm* — ScienBiziP, P.C.

(57) ABSTRACT

A reticle retaining system including an inner pod and an outer pod is described. The inner pod includes an inner base configured to receive a workpiece; an inner cover configured to couple to the inner base, thereby forming an interior for housing the workpiece; and a hold down pin movably arranged through the inner cover and configured to press the workpiece. The outer pod includes an outer base configured to receive the inner base, an outer cover configured to couple to the outer base, and a pushing element arranged on the outer cover. The hold down pin, the outer cover and the pushing element have a charge dissipation property. When the pushing element pushes the hold down pin to press the workpiece, a charge dissipation path is established from the received workpiece, through the hold down pin and the pushing element, to the outer cover.

20 Claims, 11 Drawing Sheets

(56) References Cited

U.S. PATENT DOCUMENTS

| | | | | |
|---|---|---|---|---|
| 9,022,216 | B2* | 5/2015 | Ku | H01L 21/67359 |
| | | | | 206/454 |
| 10,281,815 | B2* | 5/2019 | Hsueh | H01L 21/67366 |
| 10,607,871 | B2* | 3/2020 | Chiu | H01L 21/67353 |
| 10,670,976 | B2* | 6/2020 | Hsueh | G03F 1/66 |
| 11,075,098 | B2* | 7/2021 | Chiu | H01L 21/67359 |
| 2002/0144927 | A1* | 10/2002 | Brooks | H01L 21/67356 |
| | | | | 206/710 |
| 2012/0175279 | A1* | 7/2012 | Ku | G03F 7/70741 |
| | | | | 206/454 |
| 2014/0183076 | A1* | 7/2014 | Kolbow | H01L 21/67359 |
| | | | | 206/454 |
| 2019/0214287 | A1* | 7/2019 | Chiu | H01L 21/67369 |

FOREIGN PATENT DOCUMENTS

| | | |
|---|---|---|
| JP | 3181255 U | 1/2013 |
| JP | 2018120200 A | 8/2018 |
| JP | 2009227304 A | 10/2019 |
| JP | 2019528578 A | 10/2019 |
| KR | 20070106037 A | 10/2007 |
| KR | 20130003817 U | 6/2013 |
| KR | 20190085844 A | 7/2019 |
| TW | 201420462 A | 6/2014 |
| TW | 201827920 A | 8/2018 |

* cited by examiner

RETICLE RETAINING SYSTEM

CROSS-REFERENCE TO RELATED APPLICATIONS

This application claims the benefit of U.S. Provisional Patent Applications No. 62/915,652 filed on Oct. 16, 2019, which is hereby incorporated by reference herein and made a part of specification.

FIELD

This present disclosure relates to container for storage, transport, shipping and processing of fragile objects such as photomasks, reticles, and wafers, and, in particular, to retaining system for storage, transport, shipping, and processing of a reticle.

BACKGROUND

In semiconductor industry, photomask retainer (or reticle retainer) evolves with the heightened precision requirements of the payload thereof to meet the demand for increased level of protection from potential ambient hazards.

For example, newer generation reticle retainers are sometimes provided with a dual-pod configuration that include an inner pod for receiving a reticle and an outer pod for accommodating the inner pod. During delivery, a reticle may be packed inside the inner pod. For executing a lithography process, the outer pod may be opened to allow retrieval of the inner pod therefrom. The inner pod may then be opened for subsequent exposure process using the contained reticle upon arriving to an designated position inside an exposure apparatus.

In order to obtain extreme high-resolution for ever-shrinking feature patterns in modern semiconductor devices, extreme ultraviolet light source having extremely short wavelength has been used in photolithography equipment by the industry in recent years. Under such extreme exposure condition, the exposure environment, the semiconductor manufacturing equipment, and even the semiconductor manufacturing component such as a reticle are imposed with heightened standard for cleanliness.

In order to keep the reticle clean, the reticle used in the photolithography process is usually stored in a retaining system during manufacturing, transporting, storage, or other processing stages. However, since EUV photo-mask (reticle) often endures huge charge accumulation thereon during/after EUV exposure/lithography process, not all of the accumulated charges could be dissipated through the robot arm of the process equipment. Thus, there would often be noticeable amount of residual charges on the photo-mask. Also, when the reticle is moved or in use on the EUV machine, static electricity and other factors may be generated through friction with the air, thereby exposing the delicate reticle to a dangerous high-static charge environment. When a charged reticle is brought close to other objects, there may be sudden discharge that generates sparks, which may damage the delicate photo-mask pattern. Moreover, the residual charge on the photo-mask may likely make the photo-mask dust-attracting and thus difficult to clean, which in turn adversely impacts the production yield.

BRIEF DESCRIPTION OF DRAWINGS

The invention can be more fully understood by reading the following detailed description of the embodiment, with reference made to the accompanying drawings as follows.

Figure 1:
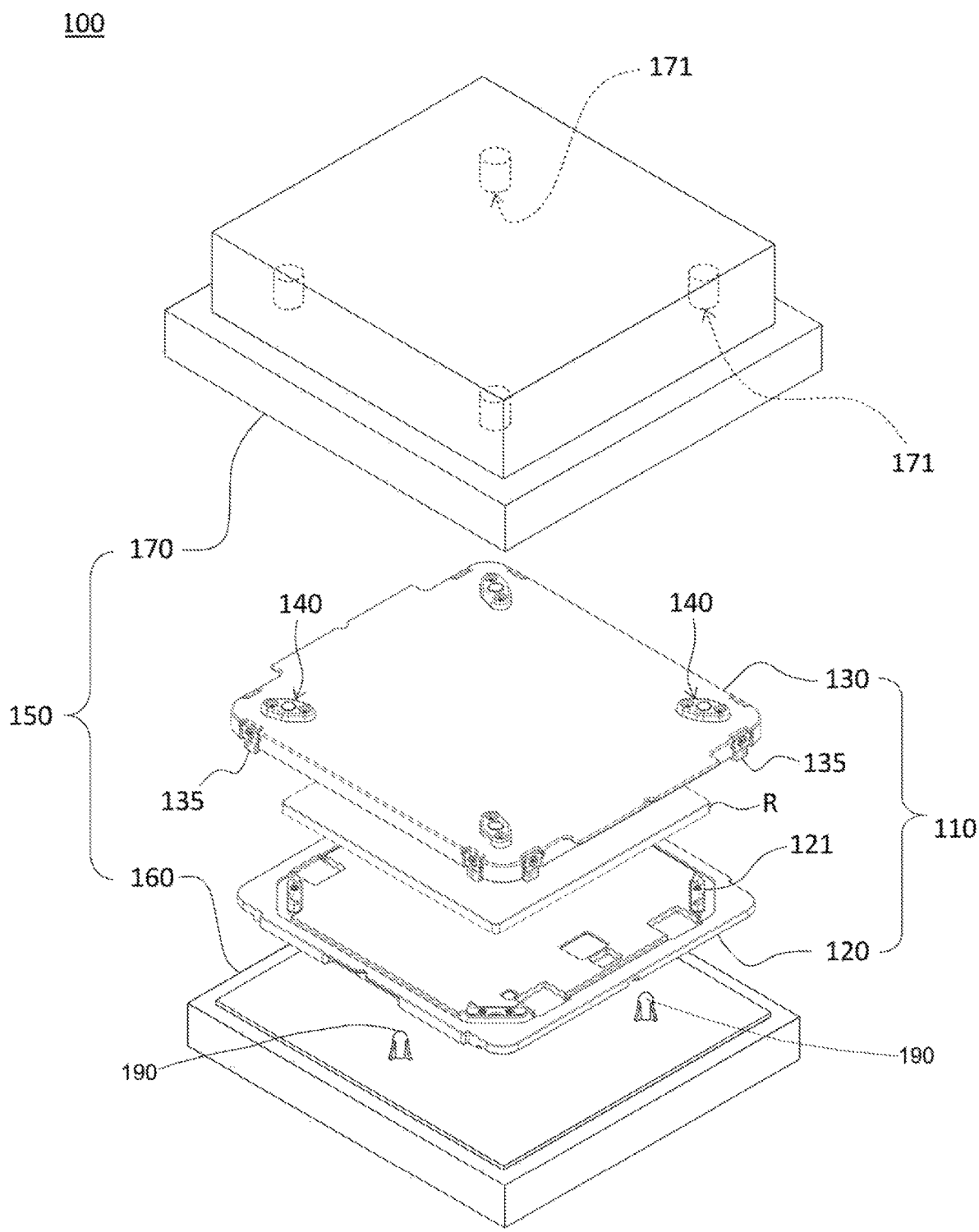
FIG. 1 illustrates an isometric view of a retaining system in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 13. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a isometric view of a retaining system in accordance with some embodiments of the instant disclosure. For illustrational simplicity and clarity, some detail/subcomponents of the exemplary system are not explicitly labeled/shown in the instant figure. In the embodiment illustrated in FIG. 1, the retaining system 100 includes an inner pod 110 and an outer pod 150. The inner pod 110 includes an inner base 120 configured to receive a workpiece R and an inner cover 130 configured to couple the inner base 120 thereby forming an interior for housing the received workpiece R. In some embodiments, the workpiece may be a reticle R. Accordingly, in some embodiments, the retaining system 100 may be referred as to a reticle retaining system.

In the illustrated embodiments, when the inner cover 130 is coupled to the inner base 120, the outer base 160 and the outer cover 170 are in contact at the periphery regions thereof, thereby forming an interior for housing the received reticle R (which is laterally surrounded by the periphery regions). Guiding members 135 arranged at selected locations of the inner cover 130 are provided, which are configured to facilitate alignment between the inner base 120 and the inner cover 130 during closure. In the illustrated example, the guiding members are distributed on the sidewalls of the inner cover. Moreover, in the embodiment illustrated in FIG. 1, a pair of guiding members 135 are arranged near a corner of the inner cover 130 at two neighboring sidewalls that cooperatively define the corner.

The inner pod of the reticle retaining system may include at least one supporting element (e.g., 121) for receiving a reticle and at least one pressing unit (e.g., 140) for pressing/holding the reticle. For example, FIG. 1 shows that the inner pod 110 includes four supporting elements 121 (one of them is shaded by the inner cover 130 thus can't be seen in FIG. 1) arranged on a top surface of the inner base 120 and four pressing unit 140 correspondingly arranged on a top surface of the inner cover 130. A supporting element 121 is configured to support a corresponding one of four corners of the received reticle R, while the corresponding pressing unit 140 is configured to press a respective corner thereof.

The outer pod 150 comprises an outer base 160 configured to receive the inner base 120 and an outer cover 170 configured to couple the outer base 160. In some embodiments, the outer cover 170 of a reticle retaining system is configured to be lockable to (e.g., by a latching mechanism that is not shown in FIG. 1) the outer base 160 when in a closed status. In some embodiments, the outer pod may include a supporting structure configured to support the inner pod. For example, the illustrated outer pod 150 includes three supporting structures 190 (one of them is shaded by the inner base 120 thus can't be seen in FIG. 1) arranged on the outer base 160. In some embodiments, the outer base 160 and the supporting structures 190 are integrally formed in one piece. In some embodiments, the supporting structures 190 are mounted on the top surface of the outer base 160. In some embodiments, the outer pod includes a pushing element configured to push the inner pod. For example, the illustrated outer pod 150 includes four pushing elements 171 located respectively corresponding to the four pressing unit 140 of the inner pod 110. In some embodiments, the outer cover 170 and the pushing elements 171 are integrally formed in one piece. In some embodiments, the pushing elements 171 are mounted at the surface of the outer cover 170 facing the inner cover 130.

Figure 2:
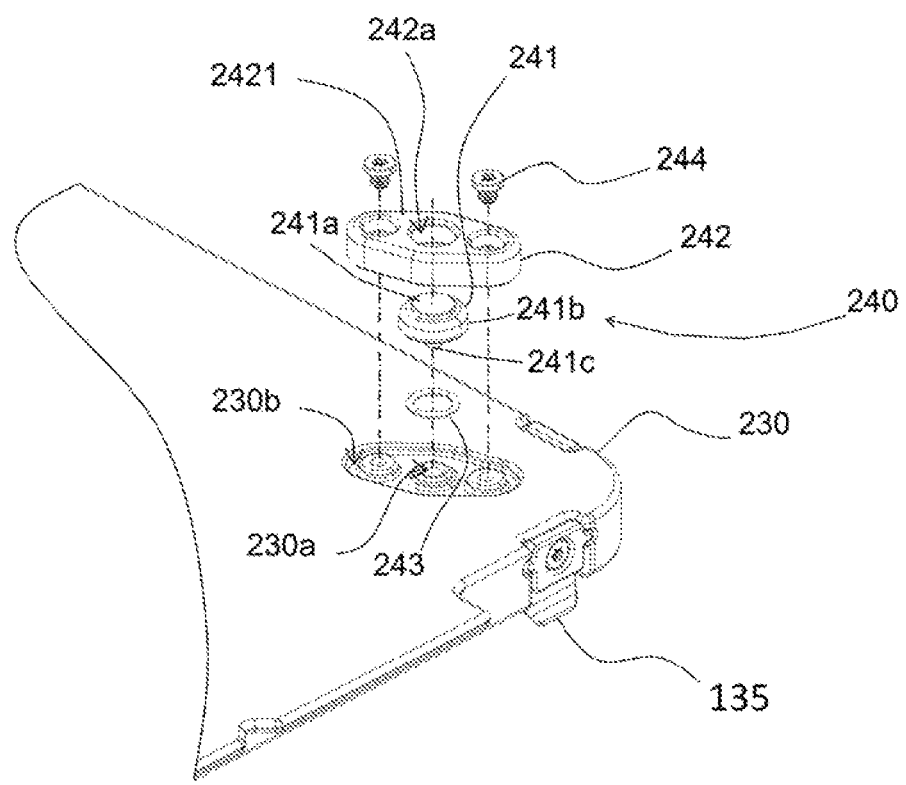
FIG. 2 illustrates an exploded view of a pressing unit in accordance with some embodiments of the instant disclosure.

FIG. 2 illustrates an exploded view of a pressing unit in accordance with some embodiments of the instant disclosure. The pressing unit 240 in the illustrated embodiment includes a hold down pin 241, a limiting cap 242, an elastic element 243, and two first fastening elements 244 arranged on the inner cover 230.

In the illustrated embodiment, inner cover 130 defines a through hole 130a for accommodating a lower portion of the hold down pin 241. The hold down pin 241 is arranged through the inner cover 230 via the through hole 130a. The hold down pin is configured to press onto the received workpiece (e.g., the received reticle R) there-under. For example, the structural arrangement of the pressing unit 240 allows a downward movement of the hold down pin 241 due to the compressibility of an elastic element (e.g., elastic element 243 mounted between the inner cover 230 and the hold down pin 241). Meanwhile, the limiting cap 242 is configured to limit a motion (e.g., upward) of the hold down pin 241, so as to retain the movable hold down pin 241 in the pressing unit assembly. For example, the limiting cap 242 is mounted on the inner cover 230 and defines a window 242*a* that exposes a middle portion 241*a* of the hold down pin 241, thereby confining the hold down pin 241 at a periphery 241*b* thereof. Accordingly, the hold down pin 241 is arranged to be vertically movable with respect to the inner cover 130. In some embodiments, the elastic element may be further configured to provide a certain degree of air-tightness between the hold down pin 241 and the inner cover 230. For example, the elastic element 243 has an annular structure that surrounds the through hole 230*a* defined by the inner cover 230, thereby providing a certain degree of air-tightness between the hold down pin 241 and the inner cover 230. In some embodiments, the elastic element 243 may be an O-ring.

The limiting cap 242 may be arranged on the inner cover 230 at a fixed location. In some embodiments, the limiting cap 242 is fixed onto the inner cover 230 by fastening elements such as screws 244. In the illustrated embodiment, the limiting cap 242 is received in a seating recess 230*b* defined on the inner cover 230. The recess 230*b* is provided with a contour corresponding to that of the limiting cap 242 for guiding and the orienting of limiting cap 242.

Figure 3:
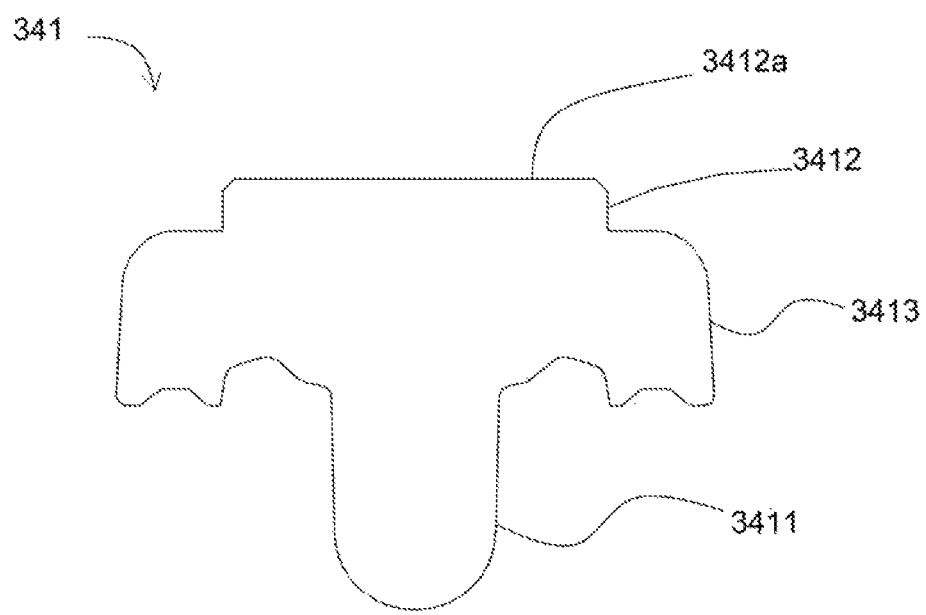
FIG. 3 illustrates a cross-sectional view of a hold down pin in accordance with some embodiments of the instant disclosure.

FIG. 3 illustrates a cross-sectional view of a hold down pin in accordance with some embodiments of the instant disclosure. The shown hold down pin 341 is provided with a pressing part 3411, a pressure receiving part 3412 opposite to the pressing part, and a shoulder part 3413 arranged there-between. The shoulder part 3413 is configured to be wider than the other two parts 3412, 3411. A pressure receiving surface 3412*a* is defined by the pressure receiving part 3412. In the illustrated embodiment, the pressure receiving surface 3412*a* is a flat surface arranged opposite to the pressing part 3411. In some embodiments, the hold down pin can be an integrally formed unitary structure made of, for example, an erosion-resistance polymer. Polymeric material not only may reduce the possibility of generating particles but also provide sufficient structural strength, thus enabling proper transmission of external force applied thereon. In some embodiments, the hold down pin 341 may be a composite unit made of multiple subcomponents.

Figure 4A:
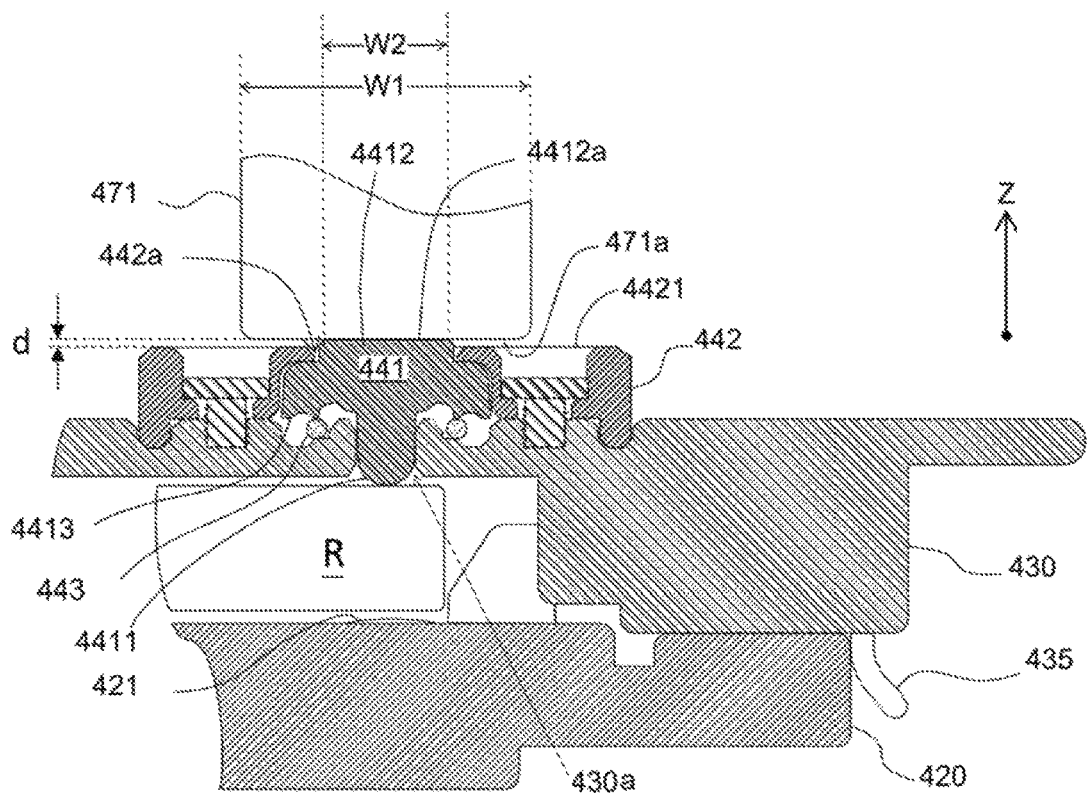
FIG. 4a illustrate a cross-sectional view of a hold down pin at a first position in accordance with some embodiments of the instant disclosure.

FIG. 4*a* illustrates a cross-sectional view of a hold down pin at a first position in accordance with some embodiments of the instant disclosure. In the illustrated scenario, inner cover 430 is coupled to the inner base 420. Guiding members 435 elastically contacts the peripheral of the inner base 420 and provides alignment/guiding during inner pod closure. FIG. 4*a* further shows that a limiting cap 442 covers (thereby confining) the hold down pin 441 at a shoulder part 4413 thereof. Moreover, a through hole 430*a* is configured to be narrower than the shoulder part 4413 such that the hold down pin 441 does not drop via the through hole 430*a*, but rather being confined between the limiting cap 442 and the inner cover 430. In the illustrated embodiment, the hold down pin 411 (e.g., the shoulder part 4413) is supported by an elastic element 443 disposed on inner cover 430 at a first position (e.g., a position where the shoulder part 4413 physically contacts the limiting cap 442). In such position, the hold down pin 411 is confined, by the elastic element 443 and the limiting cap 442. In some embodiments, the shoulder part 4413 of the hold down pin 441 may be designed in a way that the shoulder part 4413 does not touch the limiting cap 442 when being to supported by the elastic element 443.

Due to the compressibility of the elastic element 433, the hold down pin 441 is allowed to move toward the reticle R. In the other words, the hold down pin 441 is vertically (e.g., along a z-axis shown in FIG. 4*a*) movable on the inner cover 430. Meanwhile, the pressing part 4411 of the hold down pin 441 is shown to arranged through the inner cover 430 via the through hole 430*a* and configured to press the received reticle R. The hold down pin 441 is shown to contact the reticle R when at the first position, however, in some scenarios, the hold down pin 441 may not touch the reticle R when at the first position.

The window 442*a* defined by the limiting cap 442 exposes a pressure receiving surface 4412*a* of the pressure receiving part 4412, thereby allowing the exposed portion of the pressure receiving surface 4412*a* to receive downward pressure from a pushing element 470 (e.g., arranged on an outer cover of an outer pod, such as element 171 shown in FIG. 1). In some embodiments, the pressure receiving part extends upwardly (e.g., along a z-axis shown in FIG. 4*a*) through the window 442*a*. For example, in the illustrated embodiment, the pressure receiving part 4412 extends upwardly through the window 442*a* beyond top surface 4421 of the limiting cap 442, wherein the pressure receiving surface 4412*a* is higher than the top surface 4421 by a distance d.

The pushing element 470 is configured to push the hold down pin 141 at an exposed portion thereof (e.g., the pressure receiving surface 4412 shown in FIG. 4*a*) so that the hold down pin 141 may exert pressure on the received reticle R. In some scenarios, when an outer cover (e.g., the outer 170 cover shown in FIG. 1) is disposed on the outer base during closure, a pushing surface 471*a* of the pushing element 470 may push the pressure receiving part 1412. The upper surface (e.g., the pressure receiving surface 4412*a* shown in FIG. 4*a*) of the pressure receiving part 4412 is shown to be a flat surface for forming a surface-to-surface contact with the pushing surface 471*a*. As the outer cover moves toward to the outer base, the pushing surface 471*a* continues pushing down the hold down pin 441 such that the hold down pin 141 continues to press onto the reticle R. The pushing surface 471*a* with a larger area (e.g., whose lateral projection entirely covers the pressure receiving part 4412) helps to ensure uniform surface-to-surface contact with the upper surface of the pressure receiving part 4412. As such, the hold down pin 441 may be pressed directly downward with respect to the vertical, so the issue of tilted hold down pin 441 can be alleviated. Meanwhile, the elastic element 443 provides buffer while the hold down pin 441 is being pressed.

In some embodiments, the pushing element 171 is further configured to physically contact the top surface 1421 of the limiting cap 142. In the cross section shown in FIG. 4*a*, a width W2 of a projected area (i.e., a parallel projection onto a plane, where the projection lines are parallel to each other and extending along, for example, the z-axis) of the exposed portion of the pressure receiving surface 4412 is smaller than that (e.g., W1 shown in FIG. 4*a*) of the pushing element 470. This structural arrangement is applied in the illustrated embodiments shown in FIG. 11, 12, 13*a*, 14*a*. Under such arrangement, the top surface 4421 of the limiting cap 442 may serve as a limiting surface. That is, when the pushing element 470 is moved toward the received reticle R, its downward motion may be terminated when the pushing element 170 physically contacts the limiting surface 4421 of the limiting cap 442. Thus, the hold down pin 441 reaches a second position (shown in FIG. 4*b*) that is lower than the first position as previously described. In some embodiments, the material of the limiting cap 442 may possess higher structural strength than the pushing element. For example, the material for the limiting cap 442 may include metal, alloy, or similar material(s). Therefore, the pressure applied to the reticle R may be limited within a designed threshold, thus protecting the reticle R from being overly pressed. In the illustrated embodiment, the pressure receiving surface 4412a is arranged at an elevation that is higher than the top surface 4421 of the limiting cap 442 by a distance d, which is also the travel distance (i.e., the distance between the first and the second position) of the hold down pin 441.

In some embodiments, the projected area of the exposed portion of the pressure receiving surface 4412 is smaller than that of the pushing element 470. For example, the area of the pushing surface 471a shown in FIG. 4a is greater than the area of the upper surface (e.g., pressure receiving surface 4412) of the pressure receiving part 4412.

Figure 4B:
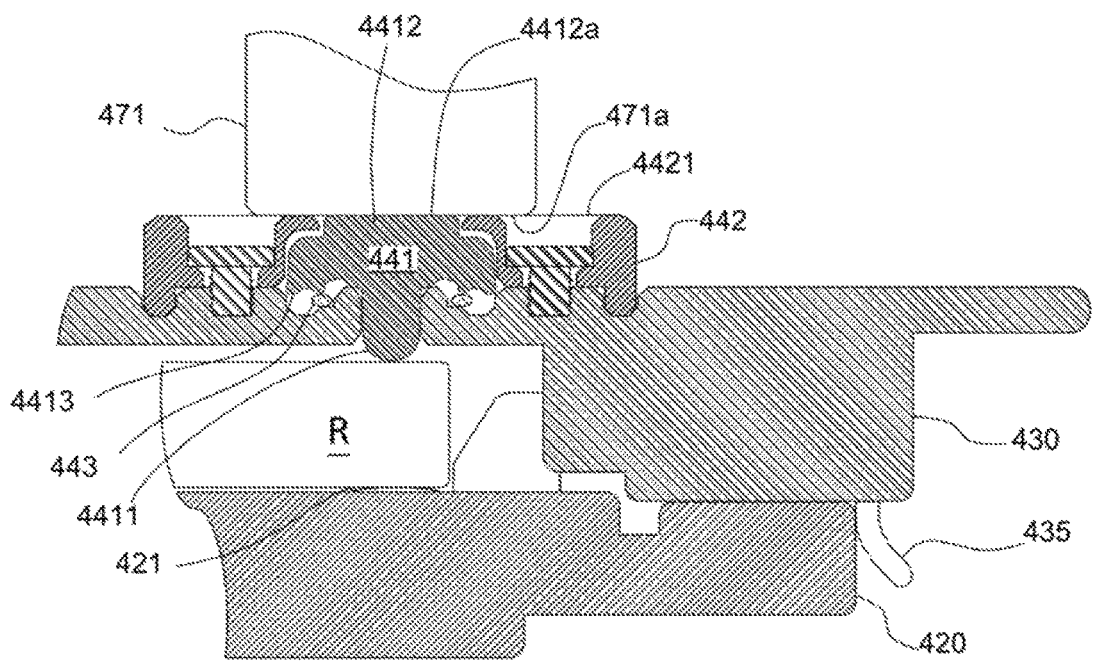
FIG. 4b illustrate a cross-sectional view of a hold down pin at a second position in accordance with some embodiments of the instant disclosure.

FIG. 4b illustrates a cross-sectional view of a hold down pin at a second position in accordance with some embodiments of the instant disclosure. In some embodiments, when the outer cover is coupled to the outer base, the hold down pin is depressed and maintained at the second position. In the illustrated embodiment, the pushing surface 471a of the pushing element 470 concurrently physically contacts the pressure receiving part 4412 of the hold down pin 441 and the limiting surface 4421 of the limiting cap 442. Moreover, the reticle R is being pressed (e.g., at a corner region of its upper surface) by the hold down pin 441. Accordingly, the reticle R may be properly supported at its lower side by the supporting element 421 while being securely retained at a substantially leveled orientation.

Figure 11:
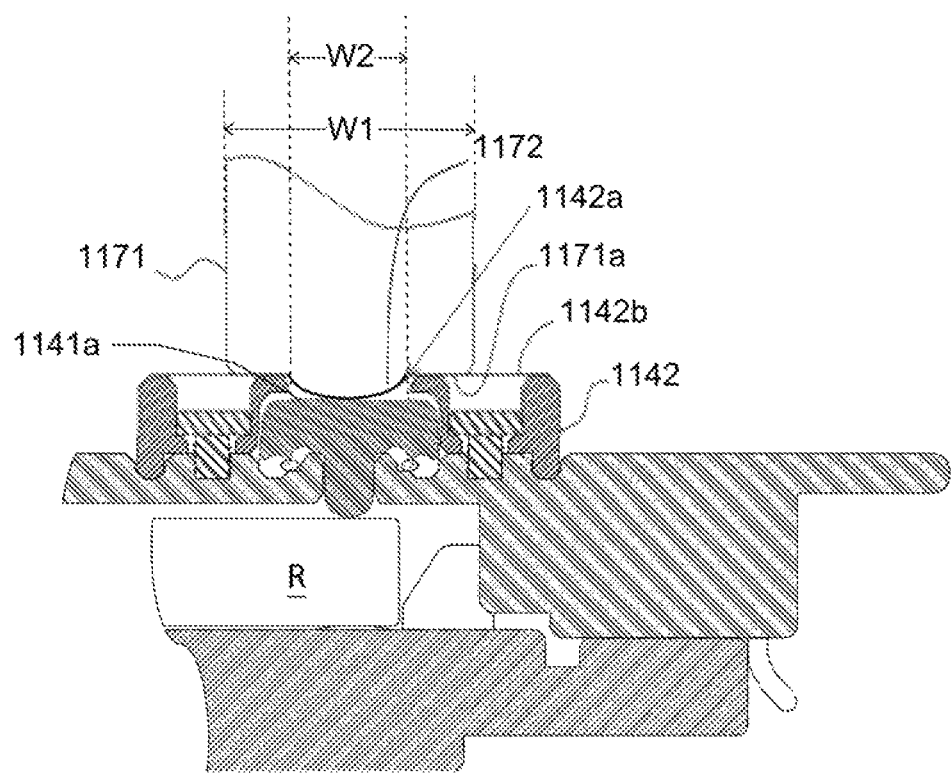
FIG. 11 illustrates a cross-sectional view of a hold down pin in accordance with some embodiments of the instant disclosure.
Figure 12:
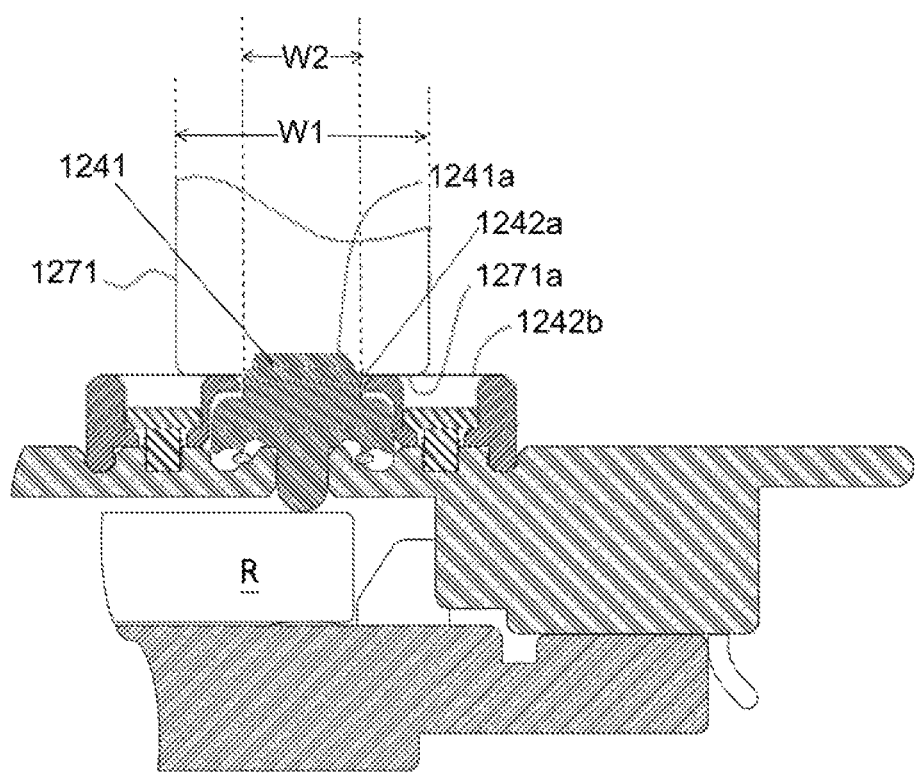
FIG. 12 illustrates a cross-sectional view of a hold down pin in accordance with some embodiments of the instant disclosure.

In the illustrated embodiment, when the pushing element 471 physically contacts the limiting surface 4421 (e.g., at a pod closure state), a top surface (e.g., limiting surface 4421) of the limiting cap 442 and an exposed portion of upper surface (e.g., pressure receiving surface 441) of the pressure receiving part 4412 are substantially coplanar. However, in other embodiments (such as shown in FIGS. 11 and 12), instead of being substantially coplanar, one of the pressure receiving surface and the limiting surface may be arranged closer to the received reticle than the other when the pushing element physically contacts the limiting surface (e.g., at a pod closure state).

Figure 5:
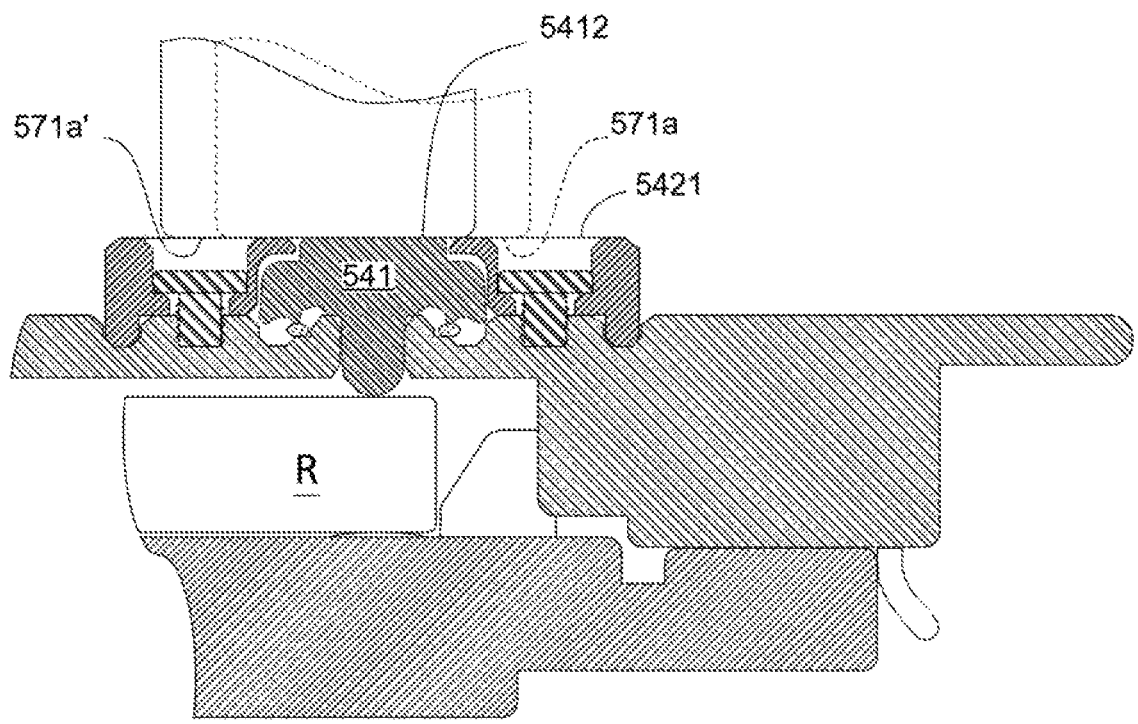
FIG. 5 illustrates a cross-sectional view of an operational scenario according to some embodiments of instant disclosure.

FIG. 5 illustrates a cross-sectional view of a scenario according to some embodiments of instant disclosure. The location on the top surface 5421 at which the pushing surface 571a physically contacts may shift due to accumulated assembly tolerance of different components in the reticle retaining system. For example, the location at which the pushing surface 571a' pushes in FIG. 5 shifts slightly left with respect to a concerted position (as shown by the dashed lines in FIG. 5). Nevertheless, since the pushing surface 571a' has a larger area (e.g., than pressure receiving surface 5412), a secure surface-to-surface contact with the pressure receiving surface 5412 may be maintained even though its lateral location is shifted, thereby compensating the adverse effects of accumulated assembly tolerance.

Figure 6:
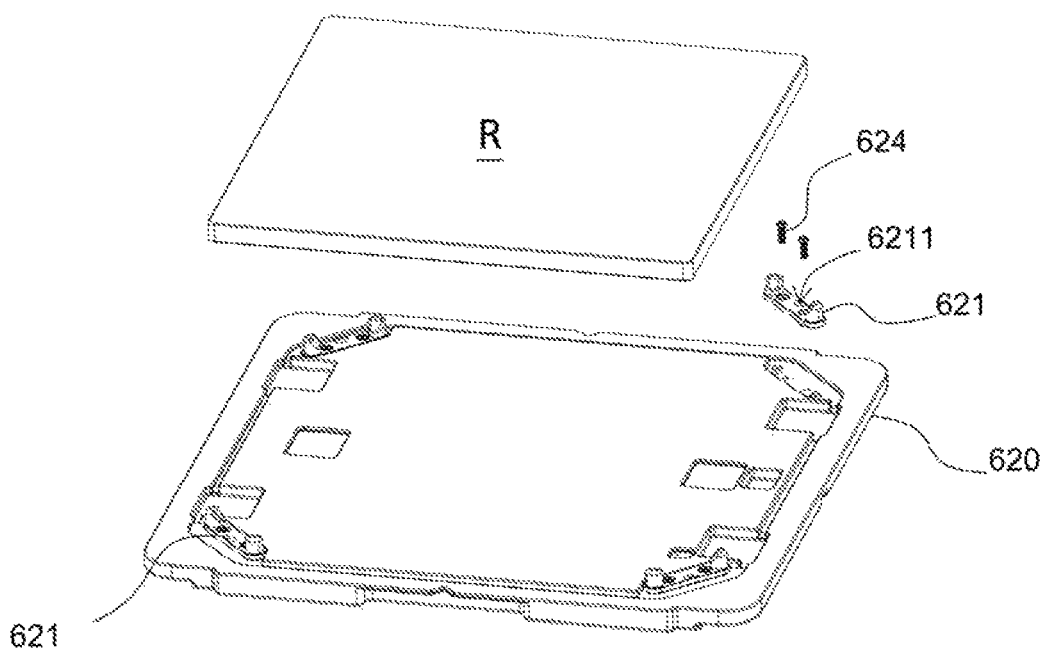
FIG. 6 illustrates an isometric view of an inner base and a workpiece in accordance with some embodiments of the instant disclosure.
Figure 7:
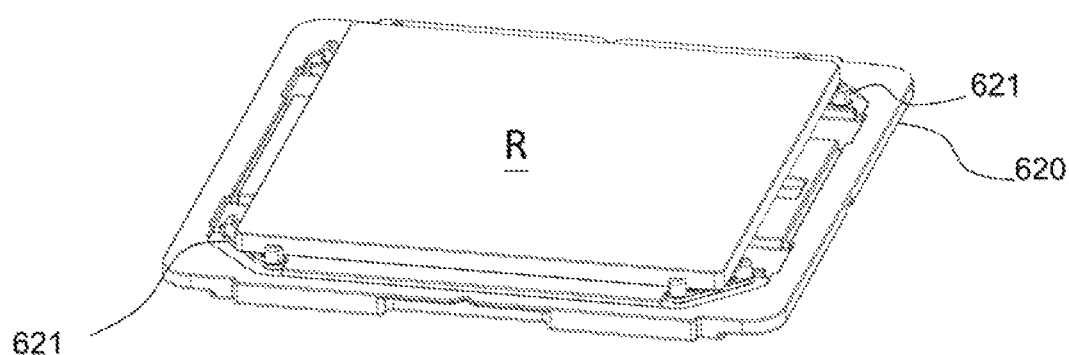
FIG. 7 illustrates an isometric view of a workpiece received by an inner base in accordance with some embodiments of the instant disclosure.

Please refer concurrently to FIGS. 6 and 7. FIG. 6 shows a isometric view of an inner base and a workpiece according to an embodiment of instant disclosure. FIG. 7 shows a isometric view of an inner base and a received workpiece according to an embodiment of instant disclosure. In the illustrated embodiment, the inner base 620 includes four supporting elements 621. In some embodiments, the supporting elements are fixed onto the inner base. In some embodiments, the inner base 620 of the illustrated embodiment further includes a second fastening element 624 for fastening the supporting elements 621 onto the inner base 620. The four supporting element 621 are respectively arranged near the four corners of the received reticle R in a way that the reticle can respectively be supported by the supporting elements 621 at a substantially leveled orientation. Each one of the supporting elements 621 has a supporting bump 6211 through which the reticle R can be supported at its lower side. In some embodiments, the supporting element 621 may be an integrally formed structure of erosion-resistance polymer. The polymeric material(s) not only may reduce the likelihood of generating particles, but also provide sufficient the structural strength to properly support the reticle R on the inner base 620. In some embodiments, the inner cover (e.g., inner cover 130 shown in FIG. 1) includes four pressing units (e.g., pressing units 140 shown in FIG. 1) corresponding to the four supporting elements 621. Each corner of the reticle R is pressed by a corresponding one of the pressing units and be supported by a corresponding supporting element 621. As such, of the evenly distributed contact interfaces allows the reticle R to be securely held at a substantially leveled orientation.

Figure 8:
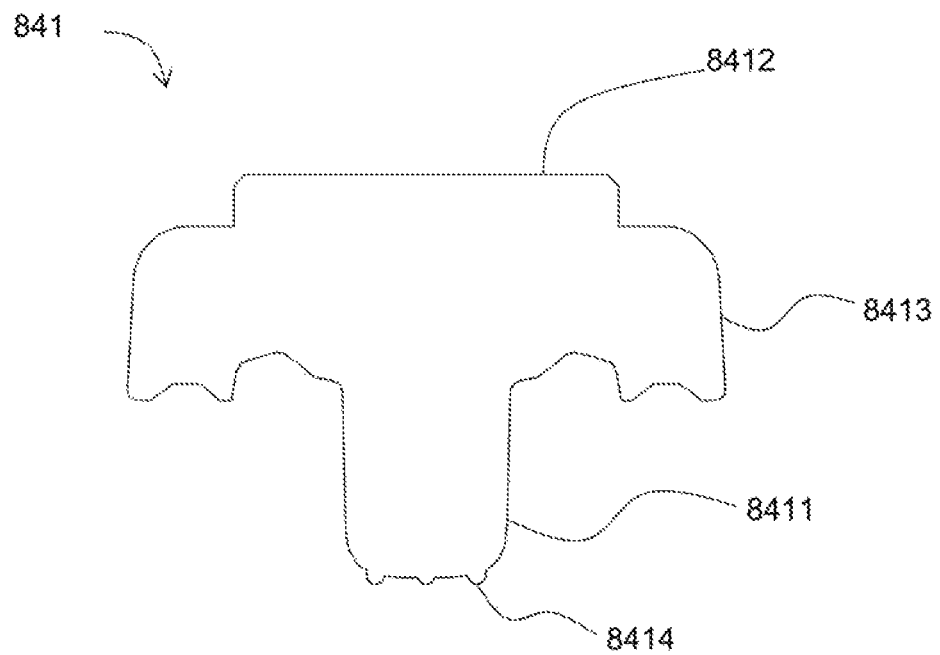
FIG. 8 illustrates a cross-sectional view of a hold down pin in accordance with some embodiments of the instant disclosure.

Referring to FIG. 8, which shows a cross-sectional view of a hold down pin according to another embodiment of instant disclosure. The hold down pin 841 has a pressing part 8411 and a oppositely arranged pressure receiving part 8412, and a shoulder part 8413 arranged between the pressing part 8411 and the pressure receiving part 8412. Several contact protrusions 8414 are disposed on the hold down pin 841. These contact protrusions 8414 are arranged at one end of the pressing part 8411 substantially on the same horizontal level so as to enable concurrent contact with the reticle (e.g., reticle R shown in FIG. 4b). When multiple contact protrusions 8414 concurrently press the reticle, the pressure applied to the reticle may be dispersed over those contact protrusions 8414, which further lowers the chance of damaging the reticle. In some embodiments, the contact protrusion may be a protruding ring pattern arranged on the downward facing surface of the pressing part 8411.

Figure 9:
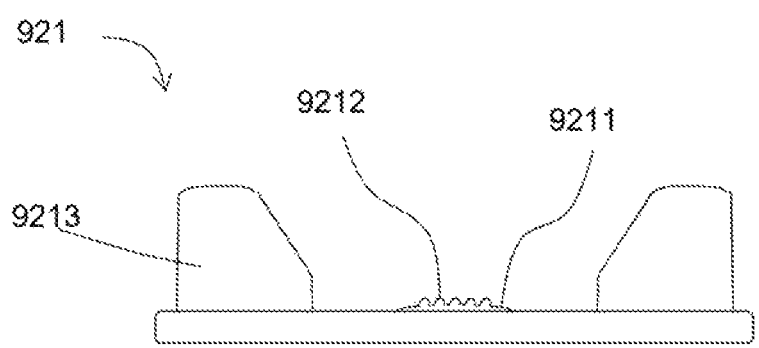
FIG. 9 illustrates a cross-sectional view of a supporting element in accordance with some embodiments of the instant disclosure.

Referring to FIG. 9, which is a cross-sectional view of a supporting element according to another embodiment of instant disclosure. The supporting element 921 has a supporting bump 9211 and several supporting protrusions 9212 formed on and protruded from the supporting bump 9211. These supporting protrusions 9212 are substantially situated on the same horizontal level to enable concurrent contact with the reticle (e.g., reticle R shown in FIG. 4b). Likely, when multiple supporting protrusions 9212 concurrently support the reticle, the pressure applied to the reticle may be dispersed over those supporting protrusions 9212. In some embodiments, the supporting protrusion may be a protruding ring pattern arranged on the upward facing surface of supporting bump 9211. In the illustrated embodiments, a positioning post 9213 are arranged on the supporting element 921 to restrain movement of the received reticle laterally.

Figure 10B:
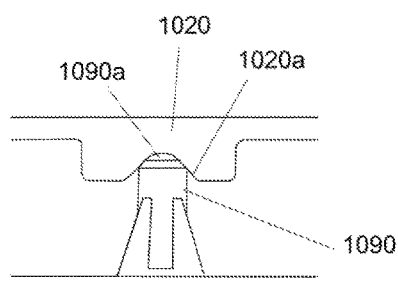
FIG. 10b illustrates a regionally enlarged side view of a supporting structure in accordance with some embodiments of the instant disclosure.
Figure 10A:
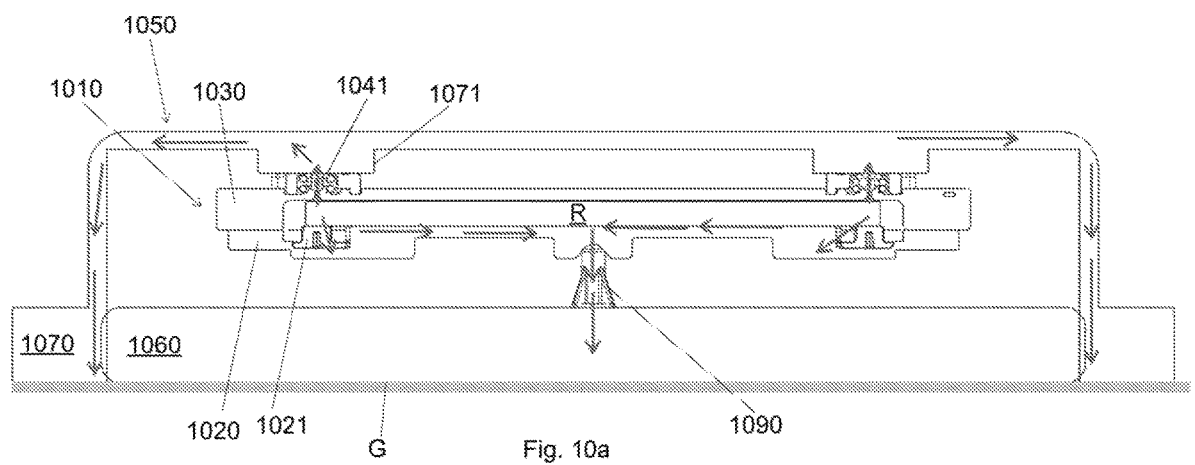
FIG. 10a illustrates a cross-sectional view of a retaining system in accordance with some embodiments of the instant disclosure.

FIG. 10a illustrates a schematic cross-sectional view of a retaining system in accordance to embodiments of instant disclosure. For illustrational simplicity and clarity, some components of the exemplary system are not explicitly labeled in the instant figure. Structural details/arrangements of components (e.g., the inner pod and the outer pod) and/or subcomponents (e.g., the inner cover and base) of the exemplary system are not explicitly shown in the instant figure. In some embodiments, said structural details/arrangements may be comparable to that of the previously described embodiments.

As shown in FIG. 10a, the outer pod 1050 receives the inner pod 1010 having a workpiece (e.g., a reticle) R housed therein. The outer cover 1070 is coupled to the outer base 1060, wherein the hold down pin 1041 is pressing the workpiece R under the pressure received from the pushing element 1071. The supporting elements 1021 arranged on the inner base 1020 are shown to touch and support the received workpiece (e.g., a reticle) R. In some embodiments, the hold down pin 1041, the outer cover 1070, and the pushing element 1071 are provided with charge dissipation property. For instance, the hold down pin 1041, the outer cover 1070, and the pushing element 1071 may comprise electrostatic dissipative material (ESD, e.g., having surface resistance $10^6$–$10^{11}\Omega$, conductive material (e.g., having surface resistance less than $10^5\Omega$), or a combination thereof. Exemplary ESD material may include Polyetheretherketone (PEEK), Polyethylene (PE), Polycarbonate (PC), etc. ESD properties may also be provided by adding conducting additives (such as carbon nano-tubes, carbon fibers (CF), carbon black (CB), etc.) to plastic material for increasing conductivity. In some embodiments, the ESD property may be achieved through surface treatment, such as by applying graphene conductive paint. In some embodiments, conductive materials such as silver, copper, gold, and aluminum may be used to construct part of, or the entirety of the components of the reticle retaining system. In some embodiments, the hold down pin 1041, the outer cover 1070, and the pushing element 1071 are made of ESD material. In some embodiments, the hold down pin 1041 and the pushing element 1071 are provided with conductive surface coatings; and the outer cover 1070 is made of carbon fiber embedded plastic material. In some embodiments, the pushing element 1071 is made of aluminum; the hold down pin 1041 is provided with surface coatings; and the outer cover 1070 is made of carbon fiber embedded plastic material. In some embodiments, the outer cover 1070 is provided with conductive surface coatings. For example, an inner surface of the outer cover 1070 may be provided with conductive surface coatings.

Accordingly, when the outer cover 1070 is coupled to the outer base 1060, the pushing element 1071 pushes the hold down pin 1041 to press the workpiece R and establishes a charge dissipation path (e.g. path indicated by arrows shown in FIG. 10a) from the received workpiece R, through the hold down pin 1041 and the pushing element 1071, to the outer cover 1070. In some embodiments, the outer cover 1070 is grounded (e.g., touches a surface labeled by G in instant figure) so as to allow accumulated charges on the received workpiece R to be dissipated through the charge dissipation path to the ground.

In some embodiments, the supporting elements 1021, the supporting structure 1090 and the inner base 1020 are provided with charge dissipation property. For example, in some embodiments, the inner base 1020 comprises conductive material; the supporting elements 1021 and the supporting structure 1090 are provided with surface coatings. In some embodiments, the positioning post (e.g., positioning post 9213) may be provided with surface coatings. Therefore, when the outer cover 1070 is coupled to the outer base 1060 (and thus the supporting elements 1021 on the inner base 1060 establishes contact with the workpiece R), a charge dissipation path (e.g. path indicated by arrows shown in FIG. 10a) may be formed from the received workpiece R, through the supporting element 1021, the inner base 1020 and the supporting structure 1090, to the outer base 1060. In some embodiments, the outer base 1060 is grounded to allow dissipation of accumulated charges on the received workpiece R (through the charge dissipation path to the ground). In some embodiments, the material of the inner pod 1010 material may also comprise conductive or static dissipative material, thereby making the inner pod 1010 part of the discharge dissipating path to enable grounding therethough.

In some embodiments, the body (or surface) of the supporting element, positioning post, and hold down pin uses the same conductive material or static dissipative material. Identical material provides identical resistance value, thereby allowing the accumulated static charge to be released from multiple places concurrently, so as to enable effective dissipation of static charge. In some embodiments, the supporting element 1021, the hold down pin 1041, and the pushing element 1070 have surface resistance value in a range from about $10^6$ to $10^{11}\Omega$. In some embodiments of the instant disclosure, wherein the supporting element 1021, the hold down pin 1041, and the pushing element 1070 have surface resistance value less than about $10^5\Omega$.

FIG. 10b illustrates a schematic regionally enlarged view of a supporting structure in accordance to embodiments of instant disclosure. Enlarged contact surface area may provide greater static charge release efficiency. A contact surface may be curved for provide increased surface area. For example, as shown in FIG. 10b, the inner base 1020 is provided with a curved interface surface (e.g., concave groove 1020a) at a bottom surface thereof. Correspondingly, the supporting structure 1090 of the outer base 1060 is also provided with a curved interface surface (e.g., convex contact surface 1090a) that substantially matches the concave surface 1020a for increasing the contact area. In some embodiments, in order to increase charge release efficiency and to enhance mechanical stability between the inner base and outer base, three or more supporting structures (e.g., supporting structures 190 in FIG. 1) are provided. Likewise, the inner base (e.g., inner base 1020) is provided with matching numbers of concave grooves (e.g., concave grooves 1020a) at locations corresponding to the supporting structures 1090. The inner pod may also be provided with concave interface(s) for establishing contact with EUV machine or robot arms. In some embodiments, the contact interface between the inner pod and the robot arm may be arranged at the lateral or bottom surface of the inner pod.

FIG. 11 illustrated a cross-sectional view of a hold down pin in accordance with some embodiments of the instant disclosure. For illustrational simplicity and clarity, some components of the exemplary system are not explicitly labeled in the instant figure. In the illustrated embodiment, the pushing element 1171 has a curved protrusion 1172 configured to extend into the window 1142a of the limiting cap 1142 when the pushing element 1171 physically contacts the limiting surface 1142b. In the exemplary embodiment, the curved protrusion 1172 is formed at a middle area of the pushing surface 1171a and arranged to press a portion of the pressure receiving surface 1141a exposed from the window 1142a. Meanwhile, the periphery area of the pushing surface 1171a is configured to physically contact the limiting cap 1142. The pressure receiving surface 1141a is shown to be closer to the received workpiece R than the limiting surface 1142b. The curved surface of the curved protrusion 1172 facilitates self-guiding/alignment between the pushing element and the window 1142a (or the exposed portion of the pressure receiving surface 1141a).

FIG. 12 illustrates a cross-sectional view of a hold down pin in accordance with some embodiments of the instant disclosure. For illustrational simplicity and clarity, some components of the exemplary system are not explicitly labeled in the instant figure. In the illustrated embodiment, the pressure receiving part 1241 extends upwardly beyond the limiting surface 1242b when the pushing element 1271 physically contacts the limiting surface 1242b. The pushing element 1271 is provided with a concave profile for receiving the pressure receiving part 1241. The limiting surface

1242b is shown to be closer to the received workpiece R than the pressure receiving surface 1241a. In some scenarios, the oblique surface of the pressure receiving part 1241 helps to align the pushing element 1271 to the window 1242a and the exposed portion of the pressure receiving surface 1241a.

Figure 13A:
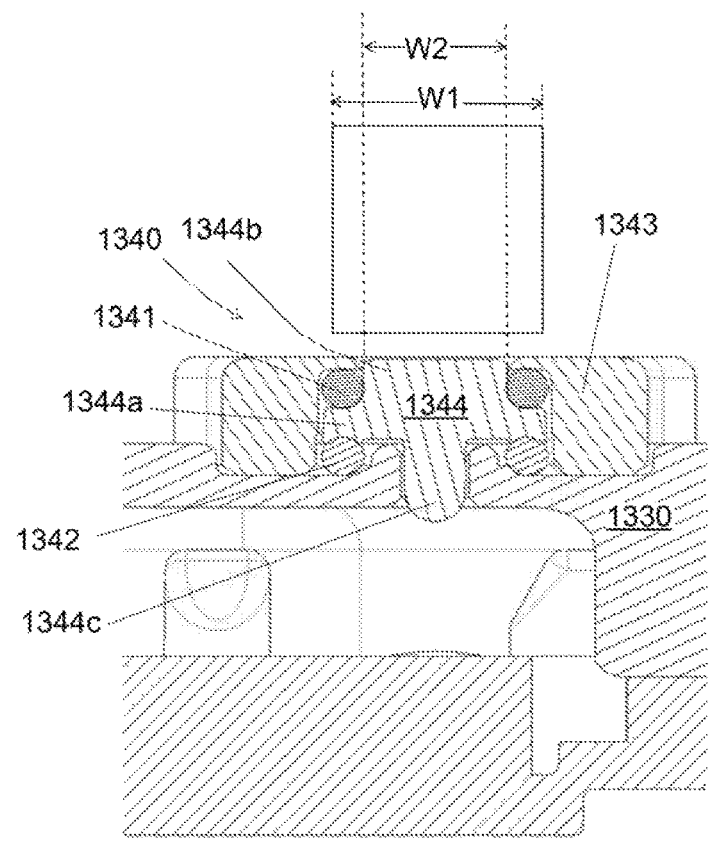
FIG. 13a illustrates a regionally enlarged view of an retaining system in accordance with some embodiments of the instant disclosure.

FIG. 13a illustrates a regionally enlarged view of a retaining system in accordance with some embodiments of the instant disclosure. For illustrational simplicity and clarity, some components of the exemplary system are not explicitly labeled in the instant figure.

In some embodiments, in addition to the elastic element arranged between the hold down pin and the inner cover elastic element 443 as shown in FIG. 4), an additional elastic element may be provided between the hold down pin and a limiting cap. For example, in the illustrated embodiment, a first elastic element 1341 is provided between a limiting cap 1343 and a shoulder part 1344a of a hold down pin 1344, a second elastic element 1342 is arranged between the shoulder part 1344a and an inner cover 1330.

In some embodiments, the first elastic element 1341 may be further configured to provide a certain degree of air-tightness between the hold down pin 1344 and the limiting cap 1343. For example, in the illustrated embodiment, the elastic element 1341 is arranged in physical contact with the limiting cap 1343 and the hold down pin 1344, and is provided with an annular structural profile that loops around a pressure receiving part 1344b of the hold down pin 1344. Likewise, the second element 1342 may be configured to provide air-tightness between the hold down pin 1344 and the inner cover 1330. For example, in the illustrated embodiment, the second elastic element 1342 is arranged to physically contact the hold down pin 1344 and the inner cover 1330, and is also provided with an annular structure that loops around a pressing part 1344c of the hold down pin 1344. Moreover, when shoulder part 1344b is sandwiched between the first and the second elastic element 1341, 1342, a longitudinal orientation of the hold down pin 1344 may be firmly retained (e.g., normal to the reticle), thereby further ensuring the uprightness of the hold down pin during pressing operation.

Compared with the exemplary embodiment shown in FIG. 4a (in which the shoulder part 4413 physically contacts the limiting cap 442), the double elastic element configuration as depicted in FIG. 13a/b may further reduce physical abrasion between the shoulder part 1313 and the limiting cap 1343 when the hold down pin 1341 is operated. For one thing, the reduced contact interface between the hold down pin 1344 and the limiting cap 1343 helps to reduce friction between the moving part and its surrounding components. The reduced abrasion may further decrease the likelihood of dust/particle (or even static charge) generation during operation. In some embodiments, the first elastic element 1341 may be made of softer materials compared to the limiting cap 1343 and hold down pin 1344.

Figure 13B:
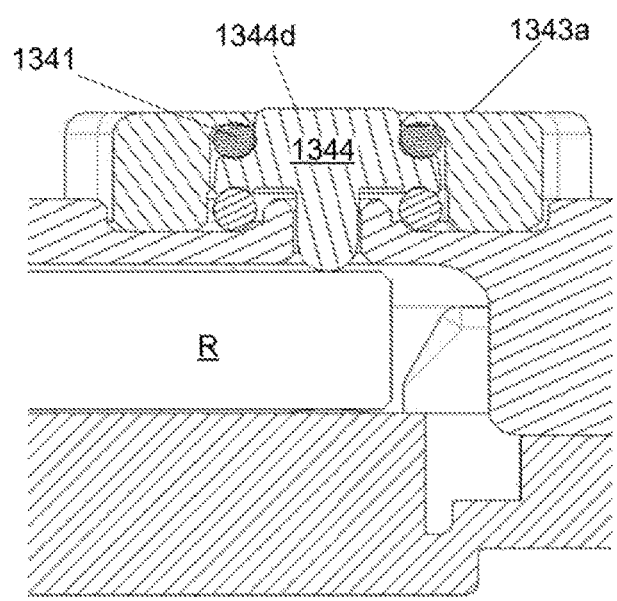
FIG. 13b illustrates a regionally enlarged view of a retaining system housing a reticle in accordance with some embodiments of the instant disclosure.

FIG. 13b illustrates a regionally enlarged view of a retaining system with a work piece (e.g., reticle R) housed therein, in accordance with some embodiments of the instant disclosure. For illustrational simplicity and clarity, some components of the exemplary system are not explicitly labeled in the instant figure.

In some embodiments, when a workpiece is received by an inner pod, a hold down pin may be elevated by a received workpiece. In the illustrated embodiment, the hold down pin 1344 is pushed upwardly by the received reticle R to a raised (protruding) position. At the position, a pressure receiving surface (e.g., surface 1344d) of the hold down pin 1344 is elevated to a higher level than that of a limiting surface (e.g., surface 1341a) of the limiting cap 1343. At this stage, the first elastic element 1341 provides buffer while the hold down pin 1344 is elevated.

Figure 14A:
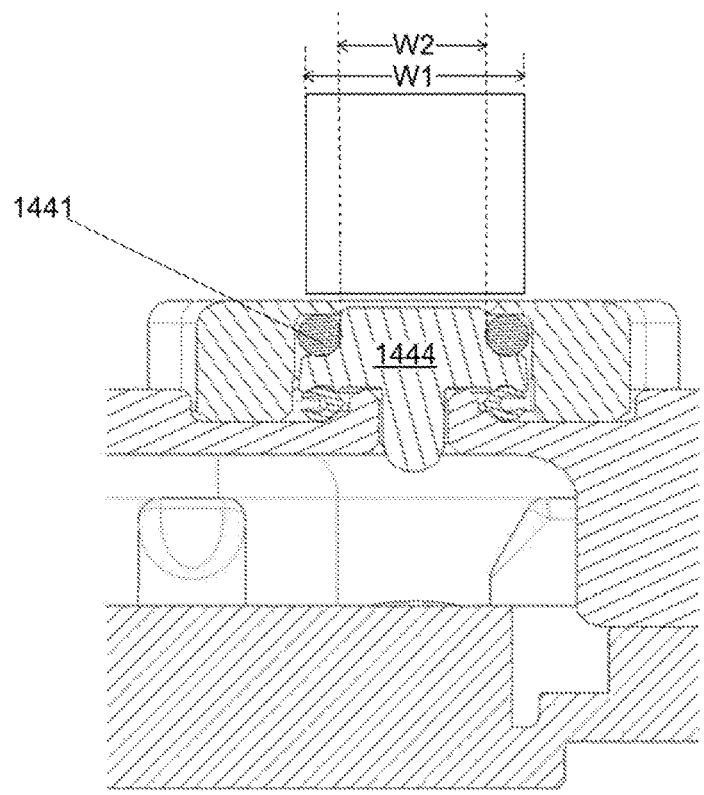
FIG. 14a illustrates a regionally enlarged view of a retaining system in accordance with some embodiments of the instant disclosure.

FIG. 14a illustrates a regionally enlarged view of a retaining system in accordance with some embodiments of the instant disclosure. For illustrational simplicity and clarity, some components of the exemplary system are not explicitly labeled in the instant figure.

In some embodiments, a first elastic element may have a rounded contour in a cross section. For example, a first elastic element 1441 is shown to have a rounded contour in a cross section thereof. Nevertheless, in some embodiments, the contour may be a polygon contour such as square, pentagon, etc.

Figure 14B:
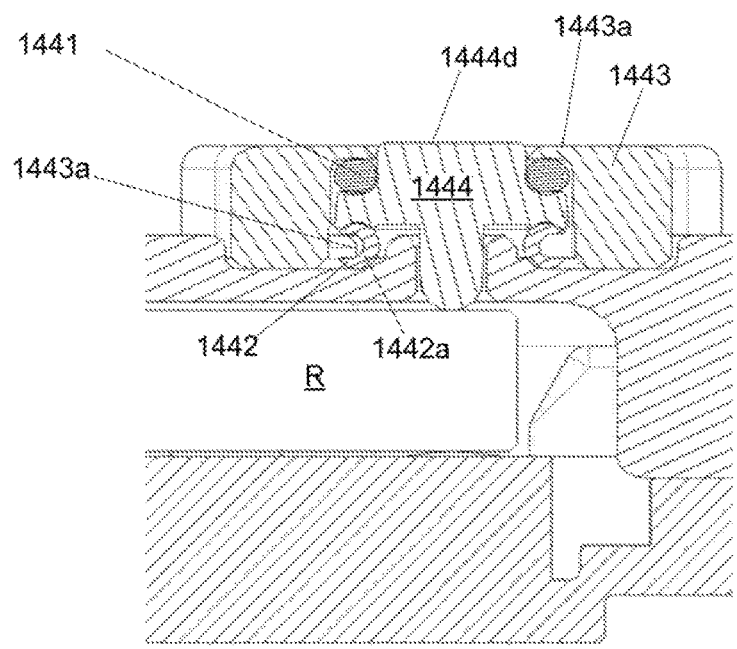
FIG. 14b illustrates a regionally enlarged view of a retaining system housing a reticle in accordance with some embodiments of the instant disclosure.

FIG. 14b illustrates a regionally enlarged view of a retaining system receiving a workpiece in accordance with some embodiments of the instant disclosure. For illustrational simplicity and clarity, some components of the exemplary system are not explicitly labeled in the instant figure.

In some embodiments, when a workpiece ((e.g., reticle R) is received by an inner pod, a hold down pin is elevated by the received workpiece. In the illustrated embodiment, the hold down pin 1444 is pushed upwardly by a received reticle R to a position. At the position, a pressure receiving surface 1444d of the hold down pin 1444 is raised to a higher level than that of a limiting surface 1443a of the limiting cap 1443. At this stage, the first elastic element 1441 provides buffer while the hold down pin 1444 is elevated.

In some embodiments, a second elastic element may be provided with an engaging portion configured to structurally engage a neighboring element. For example, the engaging portion may be configured to structurally engage with a limiting cap or an inner cover. In the illustrated embodiment, the second elastic element 1442 defines a mortise profile 1442a (e.g., a concave cross-sectional profile) configured to engage (and increase retention) with a tenon structure 1443a arranged on the limiting cap 1443. In some embodiments, a cross-sectional profile of the elastic element 1142 may substantially resemble a C-shape.

Accordingly, one aspect of the instant disclosure provides a reticle retaining system comprising an inner pod. The inner pod comprises an inner base, an inner cover, a hold down pin, a limiting cap, and a first elastic element. The inner base is configured to receive a reticle. The inner cover is configured to couple the inner base thereby forming an interior for housing the received reticle. The hold down pin has charge dissipation property, including a pressing part arranged through the inner cover and configured to press the received reticle, a pressure receiving part opposite to the pressing part, and a shoulder part wider than the pressure receiving part. The limiting cap is arranged on the cover and configured to limit a motion of the hold down pin, wherein the limiting cap defines a window so that the pressure receiving part extends therein. The first elastic element is arranged between the limiting cap and the shoulder part of the hold down pin.

In some embodiments of the instant disclosure, wherein the system further comprises a second elastic element arranged between the inner cover and the shoulder part.

In some embodiments of the instant disclosure, wherein the first elastic element has an annular structure surrounding the pressure receiving part of the hold down pin.

In some embodiments of the instant disclosure, the system further comprises an outer pod. The outer pod comprises an outer base configured to receive the inner base; an outer cover configured to couple the outer base; and a pushing element configured to push the hold down pin to press the reticle when the outer cover is coupled to the outer base. Wherein a top surface of the limiting cap and an upper surface of the pressure receiving part are substantially coplanar when the outer cover is coupled to the outer base.

In some embodiments of the instant disclosure, wherein the hold down pin, the outer cover, and the pushing element have charge dissipation property; wherein when the pushing element pushes the hold down pin to press the reticle, a charge dissipation path from the received reticle, through the hold down pin and the pushing element, to the outer cover is established.

In some embodiments of the instant disclosure, wherein the inner pod further comprises a supporting element arranged on the inner base and configured to support the reticle; wherein the outer pod further comprises a supporting structure arranged on the outer base and configured to support the inner base; and wherein the supporting structure and the supporting element have charge dissipation property; wherein when the outer cover is coupled to the outer base, the supporting element touches the received reticle and establishes a charge dissipation path from the received reticle, through the inner base and the supporting structure, to the outer base.

Accordingly, one aspect of the instant disclosure provides a reticle retaining system comprising an inner pod and an outer pod. The inner pod comprises an inner base, an inner cover, a hold down pin, and a limiting cap. The inner base configured to receive a reticle. The inner cover is configured to couple to the inner base thereby forming an interior for housing the received reticle. The hold down pin has charge dissipation property, including a pressing part arranged through the inner cover, and configured to press the received reticle; and a pressure receiving surface arranged opposite to the pressing part. The limiting cap is arranged on the inner cover and configured to limit a motion of the hold down pin, wherein the limiting cap defines a window that exposes the pressure receiving surface. The outer pod comprises an outer base configured to receive the inner base; an outer cover; and a pushing element configured to push the hold down pin at an exposed portion thereof so that the hold down pin presses the reticle; wherein a width of a projected area of the exposed portion of the pressure receiving surface is smaller than that of the pushing element.

In some embodiments of the instant disclosure, wherein the limiting cap has a limiting surface facing the pushing element; wherein the pushing element is further configured to physically contacts the limiting cap; and wherein the limiting surface and the exposed portion of the pressure receiving surface are substantially coplanar when the pushing element physically contacts the limiting surface.

In some embodiments of the instant disclosure, wherein the hold down pin further comprises a pressure receiving part arranged through the window of the limiting cap, wherein the pressure receiving part defines the pressure receiving surface; and a shoulder part arranged between the pressure receiving part and the pressing part, wherein the shoulder part is wider than the pressure receiving part.

In some embodiments of the instant disclosure, wherein the limiting cap has a limiting surface facing the pushing element; wherein the pushing element is further configured to physically contacts the limiting cap; and wherein one of the pressure receiving surface of the hold down pin and the limiting surface is closer to the received reticle than the other when the pushing element physically contacts the limiting surface.

In some embodiments of the instant disclosure, wherein the pushing element has a curved protrusion configured to extends into the window defined by the limiting cap when the pushing element physically contacts the limiting surface.

Accordingly, one aspect of the instant disclosure provides a retaining system comprising an inner pod and an outer pod. The inner pod comprises an inner base configured to receive a workpiece, an inner cover configured to couple to the inner base thereby forming an interior for housing the received workpiece, and a hold down pin movably arranged through the inner cover and configured to press the received workpiece. The outer pod comprises an outer base configured to receive the inner base; an outer cover configured to couple to the outer base; and a pushing element arranged on the outer base, Wherein the hold down pin, the outer cover and the pushing element thereof have charge dissipation property. Wherein when the outer cover is coupled to the outer base, the pushing element pushes the hold down pin to press the workpiece and establishes a charge dissipation path from the received workpiece, through the hold down pin and the pushing element, to the outer cover.

In some embodiments of the instant disclosure, wherein the inner pod further comprises a supporting element arranged on the inner base and configured to support the received workpiece; wherein the outer pod further comprises a supporting structure arranged on the outer base and configured to support the inner base; wherein the supporting structure and the supporting element and the outer base charge dissipation property; wherein when the outer cover is coupled to the outer base, the supporting element touches the workpiece and establishes a charge dissipation path from the received workpiece, through the supporting element, the inner base, the supporting structure, to the outer base.

In some embodiments of the instant disclosure, wherein the supporting element, the hold down pin, and the pushing element have surface resistance value in a range from about $10^6$ to $10^{11}\Omega$.

In some embodiments of the instant disclosure, wherein the supporting element, the hold down pin, and the pushing element have surface resistance value less than about $10^5\Omega$.

In some embodiments of the instant disclosure, wherein the inner base defines a curved surface area at a bottom surface thereof; and wherein the supporting structure has a curved end surface substantially matching the curved surface area.

In some embodiments of the instant disclosure, wherein the inner pod further comprises a limiting cap arranged on the inner cover and configured to limit a motion of the hold down pin, wherein the limiting cap defines a window that exposes the hold down pin; wherein a projected area of the exposed portion of the pressure receiving surface is smaller than that of the pushing element.

In some embodiments of the instant disclosure, wherein the limiting cap has a limiting surface facing the pushing element; and wherein the pushing element is further configured to physically contact the limiting surface of the limiting cap when the outer cover is coupled to the outer base.

In some embodiments of the instant disclosure, wherein the limiting surface and the exposed portion of the pressure receiving surface are substantially coplanar when the pushing element physically contacts the limiting surface.

In some embodiments of the instant disclosure, the system further comprises an elastic element arranged physically contacting the limiting cap and the hold down pin.

The embodiments shown and described above are only examples. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A reticle retaining system, comprising:
an inner base configured to receive a reticle;
an inner cover configured to couple the inner base, thereby forming an interior for housing the reticle;
a hold down pin, including a pressing part arranged through the inner cover and configured to press the reticle, a pressure receiving part opposite to the pressing part, and a shoulder part wider than the pressure receiving part;
a limiting cap, arranged on the inner cover and configured to limit a motion of the hold down pin, wherein the limiting cap defines a window so that the pressure receiving part extends therein; and
a first elastic element arranged between the limiting cap and the shoulder part of the hold down pin.

2. The system according to claim 1, wherein the system further comprises a second elastic element arranged between the shoulder part and the inner cover.

3. The system according to claim 1, wherein the first elastic element has an annular structure surrounding the pressure receiving part of the hold down pin.

4. The system according to claim 1, further comprising an outer pod, the outer pod comprising:
an outer base configured to receive the inner base;
an outer cover configured to couple to the outer base; and
a pushing element arranged on the outer cover and configured to push the hold down pin to press the reticle when the outer cover is coupled to the outer base;
wherein a top surface of the limiting cap and an upper surface of the pressure receiving part are substantially coplanar when the outer cover is coupled to the outer base.

5. The system according to claim 4, wherein:
the hold down pin, the outer cover, and the pushing element have a charge dissipation property; and
when the pushing element pushes the hold down pin to press the reticle, a charge dissipation path is established from the reticle, through the hold down pin and the pushing element, to the outer cover.

6. The system according to claim 4, wherein:
the system further comprises a supporting element arranged on the inner base and configured to support the reticle;
the outer pod further comprises a supporting structure arranged on the outer base and configured to support the inner base;
the supporting structure and the supporting element have a charge dissipation property; and
when the outer cover is coupled to the outer base, the supporting element touches the reticle and establishes a charge dissipation path from the reticle, through the inner base and the supporting structure, to the outer base.

7. A reticle retaining system, comprising:
an inner pod, comprising:
an inner base configured to receive a reticle;
an inner cover configured to couple to the inner base thereby forming an interior for housing the reticle;
a hold down pin having a charge dissipation property, the hold down pin including
a pressing part arranged through the inner cover, and configured to press the reticle; and
a pressure receiving surface arranged opposite to the pressing part; and
a limiting cap arranged on the inner cover and configured to limit a motion of the hold down pin, wherein the limiting cap defines a window that exposes the pressure receiving surface; and
an outer pod, comprising:
an outer base configured to receive the inner base;
an outer cover configured to couple the outer base; and
a pushing element configured to push the hold down pin at an exposed portion thereof so that the hold down pin presses the reticle; and
wherein a width of a projected area of the exposed portion of the pressure receiving surface is smaller than that of the pushing element.

8. The system according to claim 7, wherein:
the limiting cap has a limiting surface facing the pushing element;
the pushing element is further configured to physically contact the limiting cap; and
the limiting surface and the exposed portion of the pressure receiving surface are substantially coplanar when the pushing element physically contacts the limiting surface.

9. The system according to claim 7, wherein the hold down pin further comprises:
a pressure receiving part arranged through the window of the limiting cap, wherein the pressure receiving part defines the pressure receiving surface; and
a shoulder part arranged between the pressure receiving part and the pressing part, wherein the shoulder part is wider than the pressure receiving part.

10. The system according to claim 7, wherein:
the limiting cap has a limiting surface facing the pushing element;
the pushing element is further configured to physically contact the limiting cap; and
one of the pressure receiving surface of the hold down pin and the limiting surface is closer to the reticle than the other of the hold down pin and the limiting surface when the pushing element physically contacts the limiting surface.

11. The system according to claim 10, wherein the pushing element has a curved protrusion configured to extend into the window defined by the limiting cap when the pushing element physically contacts the limiting surface.

12. A retaining system, comprising:
an inner pod, comprising:
an inner base configured to receive a workpiece;
an inner cover configured to couple to the inner base, thereby forming an interior for housing the workpiece; and
a hold down pin movably arranged through the inner cover and configured to press the workpiece; and an outer pod, comprising:
  an outer base configured to receive the inner base;
  an outer cover configured to couple to the outer base; and
  a pushing element arranged on the outer cover;
wherein the hold down pin, the outer cover and the pushing element have a charge dissipation property, and
when the outer cover is coupled to the outer base, the pushing element pushes the hold down pin to press the workpiece and establishes a charge dissipation path from the workpiece, through the hold down pin and the pushing element, to the outer cover.

13. The system according to claim 12,
wherein the inner pod further comprises a supporting element arranged on the inner base and configured to support the workpiece;
wherein the outer pod further comprises a supporting structure arranged on the outer base and configured to support the inner base; and
wherein the supporting structure, the supporting element, and the outer base have the charge dissipation property;
wherein when the outer cover is coupled to the outer base, the supporting element touches the workpiece and establishes a charge dissipation path from the workpiece, through the inner base and the supporting structure, to the outer base.

14. The system according to claim 13,
wherein the supporting element, the hold down pin, and the pushing element have a surface resistance value in a range from about $10^6$ to $10^{11}\Omega$.

15. The system according to claim 13,
wherein the supporting element, the hold down pin, and the pushing element have a surface resistance value less than about $10^5\Omega$.

16. The system according to claim 13, wherein:
the inner base defines a first curved interface surface at a bottom surface thereof; and
the supporting structure has a second curved interface surface substantially matching the first curved interface surface.

17. The system according to claim 12, wherein:
the hold down pin has a pressure receiving surface facing the pushing element;
the inner pod further comprises a limiting cap arranged on the inner cover and configured to limit a motion of the hold down pin, wherein the limiting cap defines a window that exposes a portion of the pressure receiving surface of the hold down pin; and
a projected area of the exposed portion of the pressure receiving surface is smaller than that of the pushing element.

18. The system according to claim 17, wherein:
the limiting cap has a limiting surface facing the pushing element; and
the pushing element is further configured to physically contact the limiting surface of the limiting cap when the outer cover is coupled to the outer base.

19. The system according to claim 18,
wherein the limiting surface and the exposed portion of the pressure receiving surface are substantially coplanar when the pushing element physically contacts the limiting surface.

20. The system according to claim 17, further comprising an elastic element arranged to physically contact the limiting cap and the hold down pin.

* * * * *